(12) United States Patent
Hessen-Schmidt

(10) Patent No.: US 7,712,014 B2
(45) Date of Patent: May 4, 2010

(54) SYNCHRONIZING CLOCK AND ALIGNING SIGNALS FOR TESTING ELECTRONIC DEVICES

(75) Inventor: Bent Hessen-Schmidt, Menlo Park, CA (US)

(73) Assignee: Synthesys Research, Inc., Menlo Park, CA (US)

( * ) Notice: Subject to any disclaimer, the term of this patent is extended or adjusted under 35 U.S.C. 154(b) by 465 days.

(21) Appl. No.: 11/746,527

(22) Filed: May 9, 2007

(65) Prior Publication Data

US 2007/0296476 A1 Dec. 27, 2007

Related U.S. Application Data

(60) Provisional application No. 60/746,958, filed on May 10, 2006.

(51) Int. Cl.
*G01R 31/28* (2006.01)
*G01R 31/26* (2006.01)
*G11C 29/00* (2006.01)
*G06F 11/00* (2006.01)
*H04L 1/14* (2006.01)

(52) U.S. Cl. ............... 714/798; 714/707; 714/718; 714/724; 714/750; 714/716; 365/201; 324/765

(58) Field of Classification Search ............... None
See application file for complete search history.

(56) References Cited

U.S. PATENT DOCUMENTS

| 6,201,829 | B1 * | 3/2001 | Schneider | 375/221 |
| 7,363,563 | B1 * | 4/2008 | Hissen et al. | 714/733 |
| 2004/0068683 | A1 * | 4/2004 | Hoang et al. | 714/716 |
| 2004/0153913 | A1 * | 8/2004 | Fishman et al. | 714/724 |
| 2007/0113119 | A1 * | 5/2007 | Hafed et al. | 714/700 |

* cited by examiner

*Primary Examiner*—Kevin L Ellis
*Assistant Examiner*—Guerrier Merant
(74) *Attorney, Agent, or Firm*—Peninsula IP Group; Douglas Chaikin

(57) ABSTRACT

A testing circuit includes a signal generator operative to provide a control signal in response to a reference clock signal. The control signal may include both alignment and timing information operative to synchronize the timing and output of the signal generator with a device under test. A clock recovery instrument is electrically coupled to the signal generator. The clock recovery instrument generates the reference clock signal in response to a clock signal from the device under test. The reference clock signal is synchronized with the clock signal from the device under test such that signal generator operation is synchronized with the device under test independent of the behavior of the device under test.

11 Claims, 1 Drawing Sheet

Block diagram illustrating one possible implementation of the innovation.

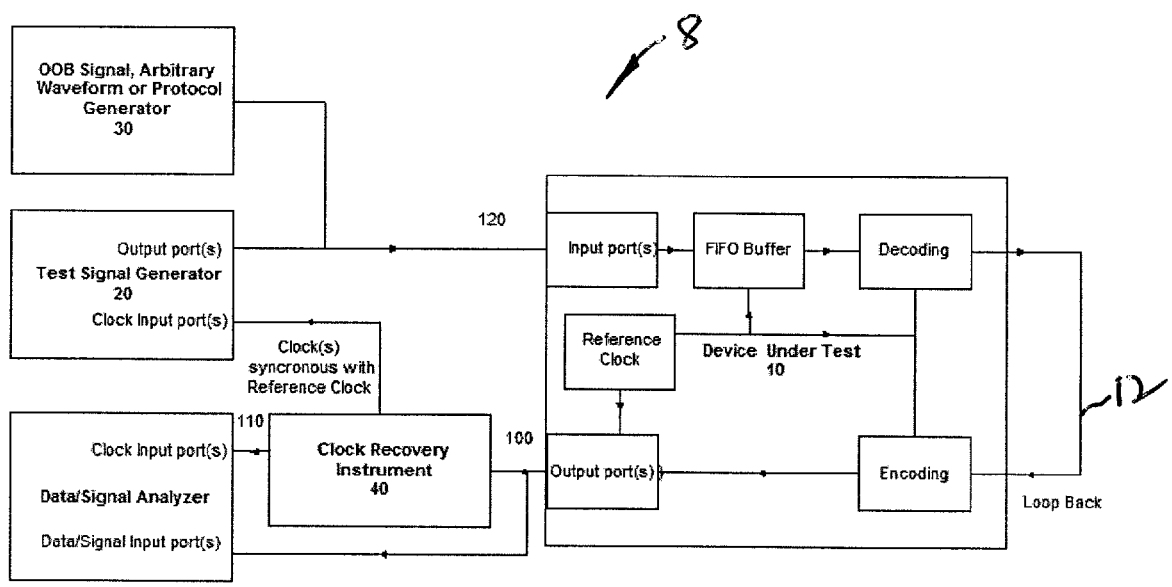
Figure 1. Block diagram illustrating one possible implementation of the innovation.

SYNCHRONIZING CLOCK AND ALIGNING SIGNALS FOR TESTING ELECTRONIC DEVICES

The instant application claims the benefit of U.S. Provisional Application Ser. No. 60/746,958, filed on May 10, 2006.

FIELD OF THE INVENTION

This invention generally relates to electronic test equipment and, more particularly, to test equipment utilizing a loop back in order to provide synchronization and alignment of signals and data while testing a device.

BACKGROUND OF THE INVENTION

Several difficulties can appear when testing receivers and device input ports; including the difficulty in accessing how well the test signal was received. This is even more challenging when one is prohibited from or lacks easy access to information collected by the receiver at the input port of the device under test. A known way around this is to set the device under test in a loop back mode where all or some of the input port signal information is returned in either raw or processed format via one of the device under test's output ports. However such known ways work best when the test equipment and the device under test are operated in a synchronous manner. If the clocks of the test apparatus and the device under test are not synchronous then byte(s) of the signal or data may be deleted or inserted by the device under test (DUT) in order to prevent overflow or accumulation of data or signal information. Many devices further decode, encode or otherwise process the signals or data that are looped back. If signals or data are incorrectly aligned when decoding and/or encoding then the looped back signal or data will differ from the expected value.

One such example is the electrical 10 bit to 8 bit (10 b/8 b) decoding and 8 bit to 10 bit (8 b/10 b) encoding used in high speed digital communications such as Fibre Channel, PCI-express and Serial ATA; if the first of the 10 data bits is not aligned then a different and perhaps invalid 8 bit word would be the outcome with possible errors as a result. Hence in the example there could be twenty different outcomes equivalent to the ten possible misalignments multiplied with the 2 different disparities that errors may cause.

In creating alignment, often various tests are required. These tests are conventionally complicated by the need for a priori knowledge of the functionality of the DUT. For example, sometimes knowledge about specialized connections or control software is needed. Other times there is a need to repeat the setting of the DUT into various test modes for each desirable test pattern, data or signal.

SUMMARY OF THE INVENTION

A testing circuit according to an exemplary embodiment of the present invention includes a signal generator operative to provide a control signal in response to a reference clock signal. The control signal may include both alignment and timing information operative to synchronize the timing and output of the signal generator with that of a device under test. A clock recovery instrument, for example, a phase locked loop, is electrically coupled to the signal generator. The clock recovery instrument generates the reference clock signal in response to a clock signal from the device under test. The reference clock signal is synchronized with the clock signal from the device under test such that signal generator operation is synchronized with the device under test independent of the behavior of the device under test.

It is an object of this invention to provide a circuit and method for testing synchronous and asynchronous electronic devices.

It is an additional object of this invention to provide such a circuit and method, which eliminates the need to have apriori detailed knowledge of the device under test (DUT).

It is an additional object of this invention to provide a circuit and a method for testing asynchronous electronic devices where apriori detailed knowledge of the DUT is not required.

In an exemplary embodiment of the circuit and method for testing synchronous and asynchronous electronic devices, the circuit employs clock recovery to synchronize the signal generator of the circuit with the clock of the DUT and a transmission of alignment data or signal to align the DUT with the data and signal of the circuit.

Using this methodology, the method and circuit 8 in accordance with the invention the need for insertion of extra bit(s) of signal or data at the DUT is removed as a step in accordance with this invention. Additionally, by using the method and circuit 8 in accordance with the invention prevents overflow.

In an exemplary embodiment the DUT is merely set into a loop-back test mode once and the circuit having a test signal generator sends the appropriate patterns that generate the desirable test data or signal on the output ports of the DUT.

Noticeably then transmitter output on port(s) of the DUT will be synchronous with the test signal generator. In order to achieve such a synchronous result the DUT and the circuit need to be aligned. Once alignment is achieved the test results can be easily verified and compared with various standards or metrics.

In another exemplary embodiment it may be faster or more convenient to have the test signal generator provide the test patterns and signals that are subsequently looped back from one of the device under test's receivers to one of the device under test's transmitters. A test signal generator in this embodiment is programmed to step through a sequence of test patterns or otherwise provide the test patterns faster than the device under test.

It is an advantage of this invention to provide a circuit and method in accordance with this invention, which allows for testing of synchronous and asynchronous electronic devices where a minimum of detailed knowledge is required of the DUT.

BRIEF DESCRIPTION OF THE DRAWING

For a further understanding of the objects and advantages of the present invention, reference should be had to the following detailed description, taken in conjunction with the accompanying drawing, in which like parts are given like reference numerals and wherein:

FIG. 1 is a schematic representation of the circuit and method in accordance with this invention.

DETAILED DESCRIPTION OF THE INVENTION

An exemplary embodiment of the present invention will now be described with reference to FIG. 1. FIG. 1 is a schematic representation of the testing circuit 8 of the present invention used to test synchronous and asynchronous devices, for example, a device under test (DUT) 10, according to the present invention. The testing circuit 8 includes a test signal generator 20 connected to a clock recovery instrument 40 by a clock synchronous with a reference clock 21. The testing circuit 8 also includes a signal analyzer 110 having a clock input port 111 coupled to the clock recovery instrument 40 via signal line 112 and a signal input port 113 coupled to the clock recovery instrument 40 via instrument line 100.

The test signal generator 20 includes one or more output ports 121 coupled to the one or more input ports 200 of the DUT 10 via communication line 120, and a clock input port 131 coupled to the reference clock 21. In one embodiment the clock recovery instrument 40 is built into or enclosed within the test signal generator 20.

In an alternative embodiment, the circuit 8 includes an alternative signal generator 30. As will be understood more fully hereinafter, the signal generator 30 comprises an arbitrary waveform generator and/or a protocol generator and is similarly connected to input ports 200 of the DUT 10.

The DUT 10 includes one or more input ports 200, one or more output ports 300, a FIFO buffer 202 and a decoding module 204, for example, an integrated circuit, a software module being executed by a processor or other control mechanism (not shown) or other suitable device or combinations thereof configured to decode any data 203 provided by the FIFO buffer 202. Typically, the DUT 10 includes a reference clock 208 and an encoding module 206, for example, an integrated circuit, a software module being executed by a processor or other control mechanism (not shown) or other suitable device or combinations thereof configured to encode data 205 provided, for example, by the encoding module 204 or the clock signals from the reference clock 208. The DUT 10 may be set in a loop back mode by either mechanical or electronic means. In order to electronically set the DUT 10 to the loop back mode, a corresponding signal 120 is transmitted to one or more of the input ports 200 of the DUT 10 by either the test signal generator 20 or the arbitrary waveform protocol generator 30. The signal 120 may be in the form of a data stream, pattern or simple digital word.

In the exemplary embodiment shown, the loop back circuit or mode 12 is initiated by the DUT 10 receiving a corresponding control signal 120 from test signal generator 20. In another exemplary embodiment, the test waveform protocol generator 30 provides the control signal 120 that sets DUT 10 in the loop back mode. The test signal generator 30 comprises one of the following an out-of-band (OOB) signal generator or arbitrary waveform generator or a protocol generator.

In the exemplary embodiment shown in FIG. 1, the clock recovery instrument 40 comprises a phase locked loop (PLL) circuit. The clock recovery instrument 40 recovers the clock timing signal 100 from at least one of the output ports 300 of the DUT 10. The recovered clock signal 100 is subsequently used to clock the data or signals sent to one or more of the DUT input ports 120 via reference clock 21.

While the recovered clock signal 100 is commonly used to recover and analyze signals and/or data, the method in accordance with this invention uses the recovered clock signal, provided to the data signal analyzer 100 on line 112, for sending signals and data 120 synchronized with the DUT 10.

Signal Alignment

The circuit and method in accordance with the invention herein also aligns the signal as well as data. The test generator 20 or in the case of the alternative embodiment, the arbitrary waveform protocol generator 30, transmits a control signal to the DUT 10 on line 120. It will, of course, be appreciated that the control signal 120 may be in the form of data or a signal pattern.

Typically the DUT 10 merely recognizes the beginning and the end of special byte or bytes or word(s) or symbol(s), for example, the ALIGN symbol used in Serial ATA. The circuit and method in accordance with the invention herein uses this functionality of the DUT 10 by either first transmitting a sequence of the special alignment byte or bytes or word(s) or symbol(s); or by embedding the special alignment byte or bytes or word(s) or symbol(s) within the sequence transmitted by the test signal generator 20 on line 120. The DUT 10 thusly aligns its internal signal processing with the test signal generator 20 creating alignment between the circuit 8 and DUT 10.

In the exemplary embodiment, the alignment is done prior to decoding, encoding and other processing. Subsequent to alignment, a second test signal is generated of a second desired test data or signal sequence and provided to the DUT 10 on line 120. In one implementation, the alignment signal and subsequent test signal (test data or signal sequences) are the same. More commonly there will be two different test signals. In other words, there will be an alignment signal where the DUT 10 recognizes the first and last bit(s) or byte(s) and subsequently a second test signal comprising a data or signal sequences. In some implementations the signals will be stored, generated or analyzed as a single stream where the one longer sequence contains both functions.

In more common implementation of the alignment method above, the test signal generator 20 first sends the ALIGN words used in Serial ATA. The generator 20 uses an arbitrary clock frequency near the nominal clock frequency of the DUT 10, while clock recovery instrument 40 recovers the clock 100 from the DUT 10. The test signal generator 20 then continues to send the test pattern including alignment data or signals using the recovered clock 100 via reference clock 21.

The change to use the recovered clock is implemented in one of two ways. Firstly, the first arbitrary but near nominal clock frequency source is switched to the clock from the clock recovery instrument 40 after the clock recovery instrument 40 has completed the acquisition and recovery of the clock timing signal 100 from at least one of the output ports 300 of the DUT 10. Or secondly, by starting the clock frequency instrument 40 at the near nominal clock frequency and continue to use said clock while waiting for the clock recovery instrument 40 to recover the clock timing signal 100 from at least one of the output ports 300 of the DUT 10. It will be appreciated that during the alignment process, either of these implementations may be used. It will also be appreciated that the user may switch between implementations as desired.

The combination of clock recovery combined with the transmission of alignment data or signals, such as the ALIGN words in Serial ATA, provides for fast synchronization of a device under test in loop back mode. Not only does the combination allow simultaneous settling of the clock frequency and data or signal alignment, but the combination also removes the difference between clock frequencies of test signal generator 20 and DUT 10. This eliminates the need to deal with insertion or deletion of bit(s) of signal or data, for example insertion or deletion of extra ALIGN words in Serial ATA, otherwise used by the DUT 10 to fill or shorten the mis-match in clock frequency. Further, the signal or data returned at the one or more output ports 300 of the DUT 10 will be aligned with the internal processing, encoding/decoding of the DUT 10 and therefore will the expected value.

Once loop back synchronization has been achieved, any combination of data or signal sequence(s) may follow, for example one of the following: high frequency, medium frequency, low frequency or lone-bit test pattern(s). Successful synchronization and alignment are achieved when there is an expected amount of bit(s) of data or signal appearing at the output ports 300 of the DUT 10. For example, there will be no less and no extra ALIGN words in a Serial ATA application. This is sometimes easier to see when switching to another test pattern or signal, such as high frequency, medium frequency, low frequency or lone-bit test pattern(s), which do not include ALIGN words or by using a pattern, such as CJTPAT in Fibre Channel, which includes portions with and without ALIGN words.

Using the circuit 8 and the method in accordance with this invention, loop back test mode synchronization is achieved in situations where the DUT 10 is unable to be set into a transmitter (output) test mode. In those cases the clock recovery instrument 40 and a data/signal analyzer 110 are used for the test, for measurement, verification or validation of a transmitter, the output ports 300 of DUT 10.

These tests are conventionally complicated by the need of a priori knowledge of the functionality of the DUT 10. For example, sometimes knowledge about specialized connections or control software is needed. Other times there is a need to repeat the setting the DUT 10 into various test modes for each desirable test pattern, data or signal.

This invention eliminates the above complications merely setting the DUT 10 in a loop-back test mode once and then allows the test signal generator 20 to send the appropriate patterns that generate the desirable test data or signal on the output ports 300 of the DUT 10. Noticeably then transmitter output on port(s) 300 of the DUT 10 will be synchronous with the test signal generator 20 and the internal processes of the DUT will be aligned with the data or signal providing a expected output on ports 300 that can be easily verified and compared with various standards or metrics.

It may be faster or more convenient to have the test signal generator 20 provide the test patterns and signals that are subsequently looped back from one of the device under test's receivers to one of the device under test's transmitters. A test signal generator 20 may for example be programmed to step through a sequence of test patterns or otherwise provide the test patterns faster than the DUT 10.

While the foregoing detailed description has described several embodiments of the circuit 8 and various methods of test synchronous and asynchronous electronic devices with clock signals in accordance with this invention, it is to be understood that the above description is illustrative only and not limiting of the disclosed invention. Particularly, there can be a variety of test input signal generators used initiating a variety of different signals or signal types. It will be appreciated there are but exemplary embodiments discussed above and that there are numerous embodiments that are not mentioned but within the scope and spirit of this invention. Thus, the invention is to be limited only by the claims as set forth below.

What is claimed is:

1. A testing circuit, comprising:
   a signal generator operative to provide a control signal in response to a reference clock signal, the control signal including alignment and timing information;
   a clock recovery instrument, operative to generate the reference clock signal in response to a clock signal from a device under test, the reference clock signal being synchronous to the clock signal, wherein the timing and output of the signal generator is synchronized with the device under test independent of the behavior of the device under test.

2. The testing circuit of claim 1, further including an arbitrary signal generator operative to provide the control signal, the control signal being asynchronous with the timing of the device under test.

3. The testing circuit of claim 1, further including a data analyzer circuit, coupled to the clock recovery instrument and the device under test, operative to analyze data provided by the device under test in response to the reference clock signal.

4. The testing circuit of claim 1, wherein the clock recovery instrument further includes a phase locked loop circuit, operative to provide the reference clock signal synchronized with a clock signal of the device under test.

5. The testing circuit of claim 2, wherein the control signal from the arbitrary signal generator is provided independently of the reference clock signal.

6. The testing circuit of claim 1, wherein the signal generator further comprises one of the following: an out-of-band signal generator, an arbitrary waveform generator, or a protocol generator.

7. The testing circuit of claim 1, wherein the control signal includes data causing the device under test to enter into a loop back mode.

8. The testing circuit of claim 2, wherein the control signal provided by the arbitrary signal generator causes the device under test to enter into a loop back mode.

9. The testing circuit of claim 1, wherein the control signal includes alignment information, the alignment information causes the device under test to align its output to the control signal before any processing is performed on the control signal, whereby, the output of the device under test is aligned with the output of the signal generator.

10. The testing circuit of claim 9, wherein the alignment information includes the Serial ATA ALIGN symbol.

11. The testing circuit of claim 9, wherein the operation of the signal generator is synchronized with the operation of the device under test in response to the reference clock signal and wherein data alignment between the signal generator and the device under test is provided in response to the alignment information provided in the control signal.

* * * * *